United States Patent [19]

Nagano

[11] 4,324,179
[45] Apr. 13, 1982

[54] METHOD OF PROOF-PRINTING IN GRAVURE PRINTING

[75] Inventor: Katsusuke Nagano, Mitaka, Japan

[73] Assignee: Dai Nippon Insatsu Kabushiki Kaisha, Tokyo, Japan

[21] Appl. No.: 836,732

[22] Filed: Sep. 26, 1977

[30] Foreign Application Priority Data

Sep. 24, 1976 [JP] Japan .................................. 51/114516

[51] Int. Cl.³ ............................................... B41N 1/06
[52] U.S. Cl. ................................... 101/170; 101/401.1
[58] Field of Search ................ 96/38, 35, 45, 30, 36.3, 96/33; 101/401.1, 170, 395

[56] References Cited

U.S. PATENT DOCUMENTS

| | | | |
|---|---|---|---|
| 3,210,188 | 10/1965 | Görig | 96/45 X |
| 3,804,622 | 4/1974 | Bergin | 96/38 |
| 3,953,212 | 4/1976 | Miyano et al. | 96/33 X |

*Primary Examiner*—J. Reed Fisher
*Attorney, Agent, or Firm*—Stevens, Davis, Miller & Mosher

[57] ABSTRACT

A gravure proof-printing method is described which comprises superposing a contact screen upon the photosensitive layer of a plate blank for offset printing, superposing further thereon a continuous-tone positive for gravure printing, exposing the plate to light from the side of the positive for photoprinting, developing the resulting plate to produce a printing plate, and using this plate to make a proof for gravure proofing and correction.

2 Claims, No Drawings

METHOD OF PROOF-PRINTING IN GRAVURE PRINTING

BACKGROUND OF THE INVENTION

This invention relates generally to gravure proofing and correction and more particularly to a simple trial proof-printing method for use in the proofing and correction of gravure printing.

In the printing of printed matter, ordinarily, it is the common practice to carry out beforehand trial proofing of the printed matter; that is, making a trial impression, for the purpose of enabling the customer or the person in charge of the printing to determine whether or not the printed matter desired by the customer will be properly produced. This is generally referred to as "proofing" "proving", or "proofing and correcting", but the number of trial impressions or proofs is very small, being of the order of a few sheets to ten and a number of sheets. This trial proofing is carried out for correcting errors of the printing plate surface, unsightly appearance, nonuniformity, and coloring. Accordingly, it must be assumed, as a premise, that a printing plate used for proofing will be corrected. Furthermore, if the proofing impression were to be different from the printed matter to be delivered to the customer, i.e., the main job impressions or the edition impressions, it would be meaningless as a proof, of course. On the other hand, from the object of proofing, it is not necessary that the proof be an impression which has been made as a result of exactly the same process and the same work as the edition impression. Accordingly, so-called proof presses for making proof impressions are being widely used.

However, in the case of gravure printing, differing from typographic printing and offset printing, the making of proofs cannot be easily carried out, and corrections during or after completion of the process of preparing the plate is difficult. For this reason, so-called blue printing or cyanotype, wherein a blue print is made from the gravure continuous-tone positive prior to the plate fabrication is substituted for proofing. While it is possible with blue-print proofing to examine the dimensions and layout of the image or characters and the like, the photographic gradation, and other features after the plate preparation, the tonal effect in the case of color gravure cannot be examined. Consequently, in such a case, it has been disadvantageously necessary to print with the main printing press or with a proof press having a construction similar to that of the main press.

SUMMARY OF THE INVENTION

It is an object of this invention to provide a very simple gravure proof-printing method in order to solve the above described problems. I have observed that, in spite of the fact that gravure printing expresses tone by means of half-tone dots, a blue printing can withstand proofing to a certain degree. Furthermore, I have developed a novel process for offset printing with the use of a gravure continuous-tone positive instead of an offset screen positive and have noted the identicality of these positives.

Gravure printing and offset printing differ in their printing methods, and their dot compositions are also different. However, this difference in these two printing methods merely means that the processes for reproducing an image identical to the original are different and does not mean that the anticipated image cannot be reproduced. Furthermore, I have noted that the difference between the dot compositions merely indicates that a difference exists in a microscopic observation, and the image of the printed matter is usually observed, as a matter of course, by naked eye, and that the proof-printing need not be carried out according to the same process and under the same work conditions as the edition printing. In fact, I have found that the proof impression for gravure printing may be made by offset printing without any adverse effect on the proofing, and this discovery constitutes a basis of this invention.

More specifically, according to this invention there is provided a gravure proof-printing method which is characterized by the steps of superposing a contact screen upon the photosensitive layer of a plate blank for offset printing, superposing further thereon a continuous-tone positive for gravure printing, exposing the plate to light from the side of the positive thereby to carry out photoprinting, developing this plate to produce a printing plate, and using this plate to make a proof for gravure proofing and correction.

The nature, utility, and further features of this invention will be more clearly apparent from the following detailed description.

DETAILED DESCRIPTION

First, for the plate for offset printing, any of those of ordinary type can be used. Examples of such offset-printing plates are polymetal plates, deep-etch plates, dry offset plates, and presensitized plates, each of which has a photosensitive layer on either of its two sides. Of these, a presensitized plate is the most desirable because of its features such as its convenience in use in view of its intended application to proofing.

For the contact screen, also, those for gravure printing and for offset printing can be used. Of these, those for offset printing are preferable.

The continuous-tone positive for gravure printing is made to specified dimensions, similarly as in an ordinary gravure printing method, from an original by photographing it to obtain a color separated continuous-tone negative through the use of a color scanner, a camera, or the like.

After the contact screen and the continuous-tone positive have been superposed in this order on and caused to closely contact the photosensitive layer of the offset printing plate, exposure to light is carried out from the positive side. This exposure can be carried out in the same manner as in the photoprinting of a halftone positive in offset printing.

After the exposure and photoprinting, the resulting plate is subjected, similarly to the case of an ordinary offset printing plate, to process steps such as, for example, developing, water washing, sensitizing treatment, water washing, removing, water washing, gumming up, and drying, whereupon a printing plate is obtained. The above mentioned developing can be carried out by an ordinary method such as the brush developing method or the spray developing method.

Next, with the use of the printing plate thus obtained, trial printing is carried out by offset printing, as in ordinary offset proofing, thereby to produce a printed matter. In this proof-printing, the hue of the ink for offset proof printing is, of course, caused to approach the hue of the gravure ink, and the use of an ink of high transparency is desirable.

In the fabrication of the printing plate used in the method of this invention, supplementary auxiliary measures and means such as the additional use of a spacer or spacers, a no-screen exposure, and flash exposure are effective. Furthermore, the continuous tone sensation reproducable by gravure printing can be made to appear by using a contact screen of fine lines such as, for example, more than 200 lines/inch.

As will be apparent from the above description, this invention provides a completely new and very simple gravure proof-printing method which, in comparison with the presently used gravure proof-printing methods, affords substantially rationalization and improvement such as a considerable shortening of the work time and lowering of the production cost. It is to be noted that this invention is effective in its application not only to ordinary gravure printing by the chemical erosion or etching method but also to gravure printing by electronic engraving.

In order to indicate more fully the nature and utility of this invention, the following specific example of practice representing a preferred embodiment of the invention is set forth below.

EXAMPLE

A contact screen of positive type (150 lines/inch) was superposed with its surface facing downward on the photosensitive layer of a presensitized plate, and, over this screen, a continuous-tone positive for gravure printing was superposed and caused to contact closely with its surface facing downward. Exposure was carried out for photoprinting by irradiation from the side of the continuous-tone positive for 10 minutes by means of a single metal-halide lamp of 2 kW.

Thereafter, the resulting presensitized plate was developed by spraying for one minute (at a running speed of the plate of 30 seconds/meter) with the use of a solution obtained by diluting 5 or 6 times a stock solution of a developer (caustic soda, sodium silicate) for presensitized plates. The plate was then washed with water, subjected to sensitizing treatment with developing ink (manufactured by Fuji Shashin Film Kabushiki Kaisha (Fuji Photographic Film Company) Japan), and then washed with water. Unwanted parts were removed with a removing solution, and the plate was again washed with water.

The plate was then subjected to gumming up and drying, whereupon a printing plate was obtained.

With this printing plate, multicolor printing was carried out on a proof press (produced by J. G. Mailänder Druckmaschinenfabrik, West Germany) in cyan, black, magenta, and yellow, in this order, with process inks for proofing (manufactured by Morohoshi Ink Kabushiki Kaisha, Japan) thereby to produce printed matters, which were effective for gravure proofing.

I claim:

1. A gravure proof-printing method which comprises superposing a contact screen upon the photosensitive layer of a plate blank for offset printing, superposing further thereon a continuous-tone positive for gravure printing, exposing the plate to light from the side of the positive for photoprinting, developing the resulting plate to produce a printing plate, and using this plate to make a proof for gravure proofing and correction.

2. A gravure proof-printing method as claimed in claim 1 in which the plate blank for offset printing is a presensitized plate.

* * * * *